United States Patent
Chen et al.

(10) Patent No.: US 10,413,065 B2
(45) Date of Patent: Sep. 17, 2019

(54) SLIDE RAIL ASSEMBLY AND RAIL KIT THEREOF

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Wei-Chen Chang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 15/991,149

(22) Filed: May 29, 2018

(65) Prior Publication Data
US 2019/0200756 A1   Jul. 4, 2019

(30) Foreign Application Priority Data
Dec. 28, 2017   (TW) .............................. 106146674 A

(51) Int. Cl.
| A47B 88/04 | (2006.01) |
| H05K 7/18 | (2006.01) |
| A47B 88/473 | (2017.01) |
| A47B 88/487 | (2017.01) |
| A47B 88/57 | (2017.01) |
| A47B 88/493 | (2017.01) |

(52) U.S. Cl.
CPC .......... *A47B 88/473* (2017.01); *A47B 88/487* (2017.01); *A47B 88/493* (2017.01); *A47B 88/57* (2017.01); *A47B 2210/0018* (2013.01)

(58) Field of Classification Search
CPC ....... A47B 88/493; A47B 88/43; A47B 88/57; A47B 88/487; H05K 7/183; H05K 7/1489
See application file for complete search history.

(56) References Cited

U.S. PATENT DOCUMENTS

| 6,367,899 | B1 * | 4/2002 | Hwang | .................. A47B 88/57 312/334.47 |
| 6,412,891 | B1 | 7/2002 | Liang et al. | |
| 6,851,774 | B2 | 2/2005 | Chen et al. | |
| 6,935,710 | B2 | 8/2005 | Chen et al. | |
| 6,938,967 | B2 * | 9/2005 | Dubon | .................. H05K 7/1421 312/330.1 |
| 7,029,080 | B2 * | 4/2006 | Barry, Jr. | ............. H05K 7/1489 312/333 |
| 7,708,359 | B2 * | 5/2010 | Peng | ..................... A47B 88/57 312/334.44 |

(Continued)

*Primary Examiner* — Kimberley S Wright
(74) *Attorney, Agent, or Firm* — Rosenberg, Klein & Lee

(57) ABSTRACT

A slide rail assembly includes a first rail, a second rail, a first locking mechanism, and a second locking mechanism. The second rail can be displaced with respect to the first rail. The first locking mechanism and the second locking mechanism are arranged at two different portions of the second rail respectively and are configured to lock the second rail at two predetermined extended positions respectively. The first locking mechanism and the second locking mechanism can be operated so that the second rail is no longer locked by the locking mechanisms and can be retracted with respect to the first rail.

19 Claims, 10 Drawing Sheets

(56) References Cited

U.S. PATENT DOCUMENTS

| | | | | |
|---|---|---|---|---|
| 7,918,517 | B2* | 4/2011 | Chen | A47B 88/57 312/334.46 |
| 8,240,789 | B2* | 8/2012 | Chen | F16C 29/046 312/333 |
| 8,303,052 | B2* | 11/2012 | Chen | A47B 88/493 312/319.1 |
| 8,622,492 | B2* | 1/2014 | Chen | F16B 21/09 312/333 |
| 9,681,749 | B2* | 6/2017 | Chen | A47B 88/49 |
| 9,980,566 | B2* | 5/2018 | Chen | F16C 43/04 |
| 10,213,017 | B2* | 2/2019 | Chen | H05K 7/1489 |
| 2005/0017614 | A1* | 1/2005 | Cirocco | A47B 88/49 312/333 |
| 2006/0029304 | A1* | 2/2006 | Chen | A47B 88/493 384/18 |
| 2007/0164644 | A1* | 7/2007 | Hwang | A47B 88/49 312/333 |
| 2009/0096340 | A1* | 4/2009 | Chen | A47B 88/493 312/334.46 |
| 2009/0195133 | A1* | 8/2009 | Chang | A47B 88/493 312/334.46 |
| 2010/0259146 | A1* | 10/2010 | Chen | A47B 88/493 312/319.1 |
| 2012/0106880 | A1* | 5/2012 | Chen | H05K 7/1489 384/49 |
| 2012/0120578 | A1* | 5/2012 | Henderson | H05K 7/1489 361/679.02 |
| 2013/0259411 | A1* | 10/2013 | Judge | F16C 29/04 384/49 |
| 2014/0327352 | A1* | 11/2014 | Chen | E05D 15/0686 312/334.46 |
| 2017/0208942 | A1* | 7/2017 | Chen | F16C 29/123 |

* cited by examiner

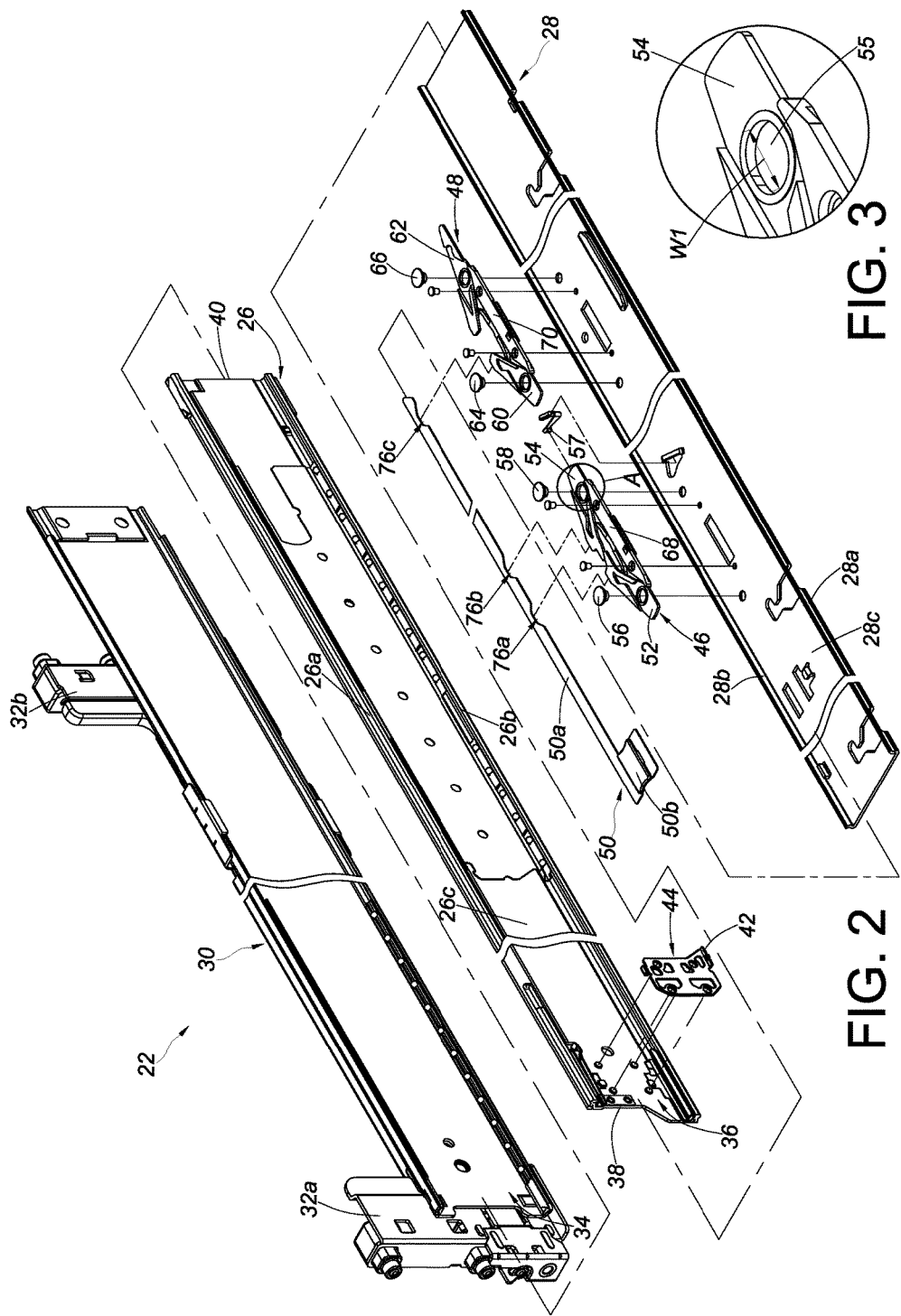

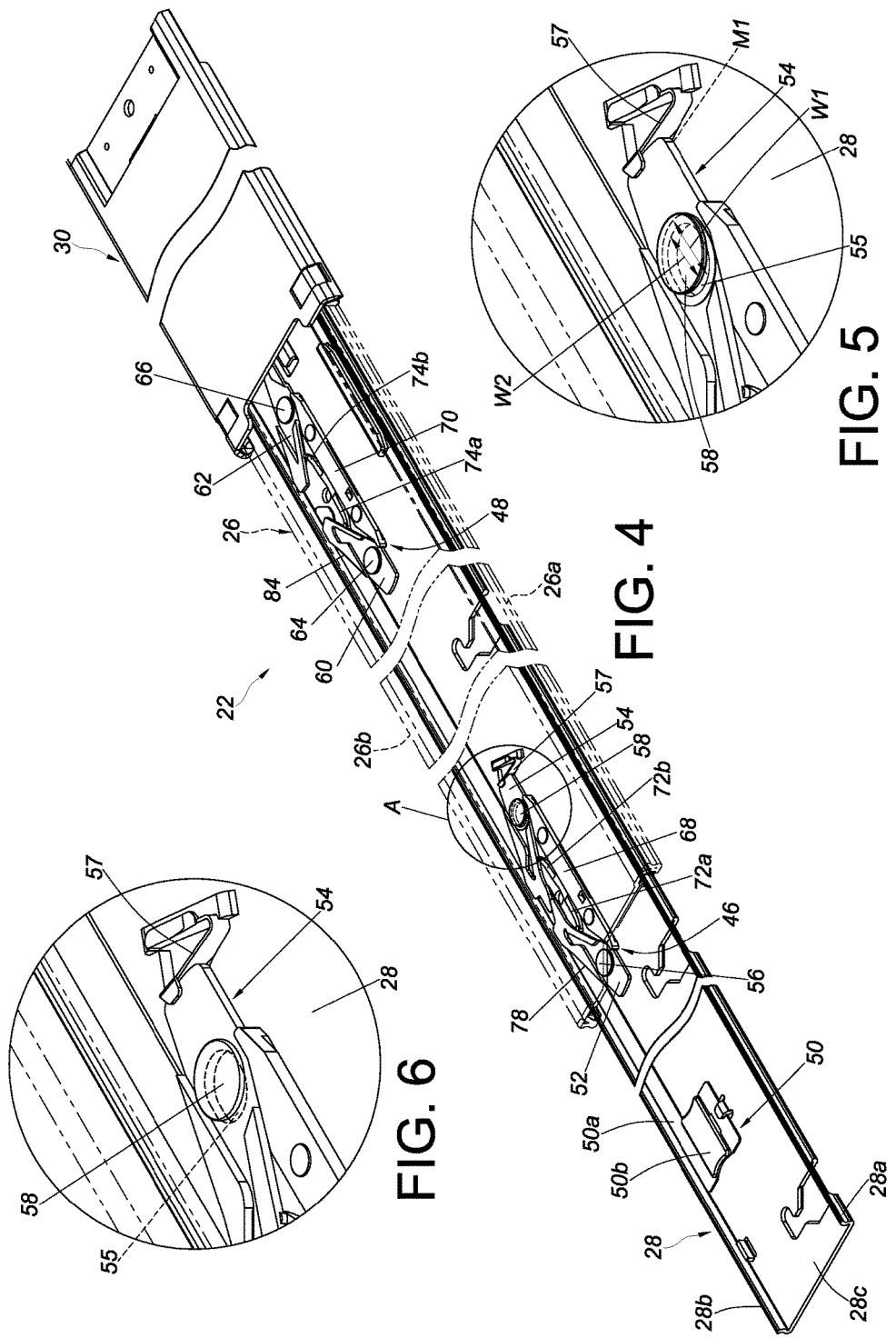

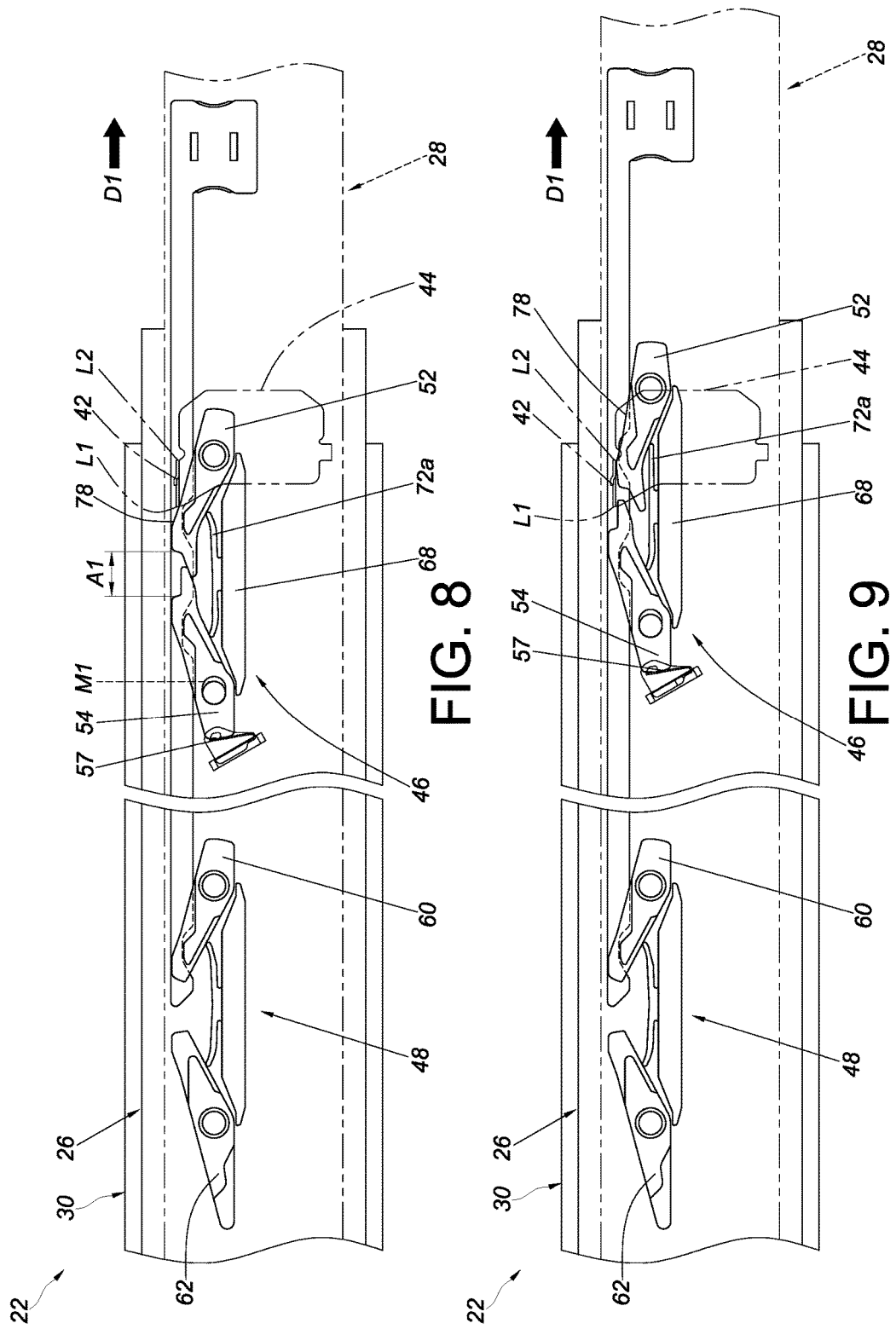

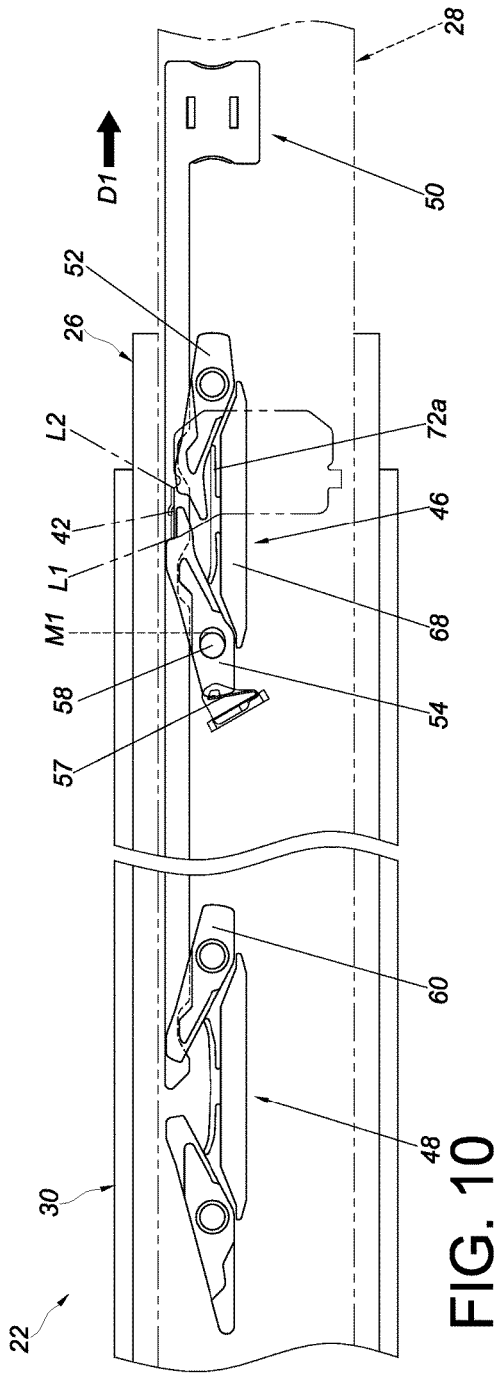
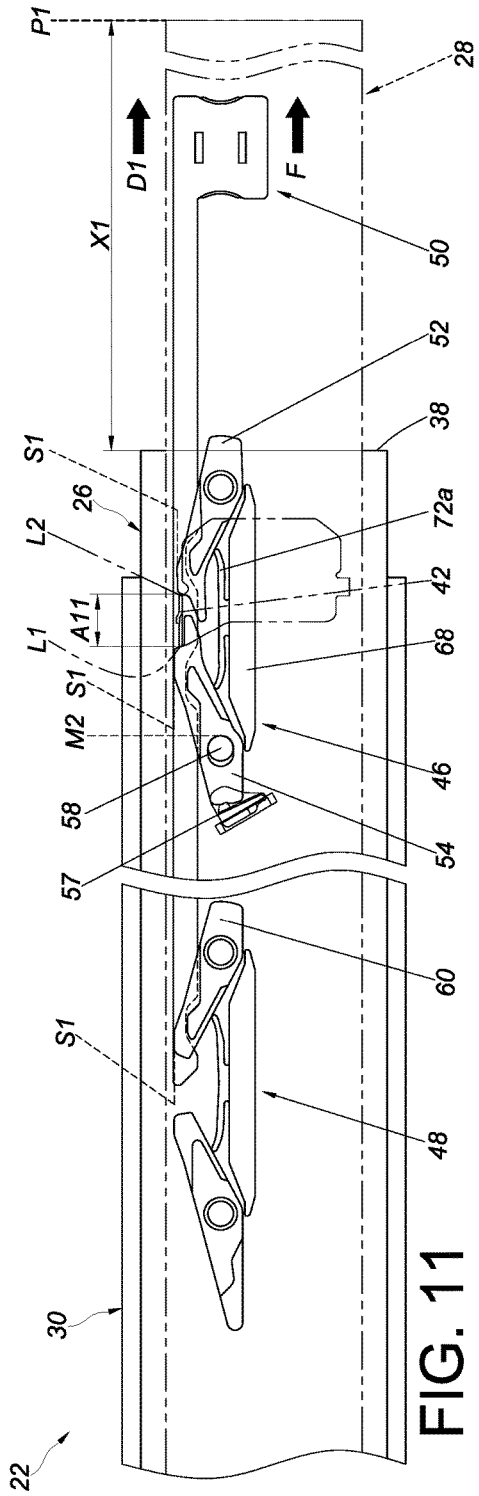
FIG. 10
FIG. 11

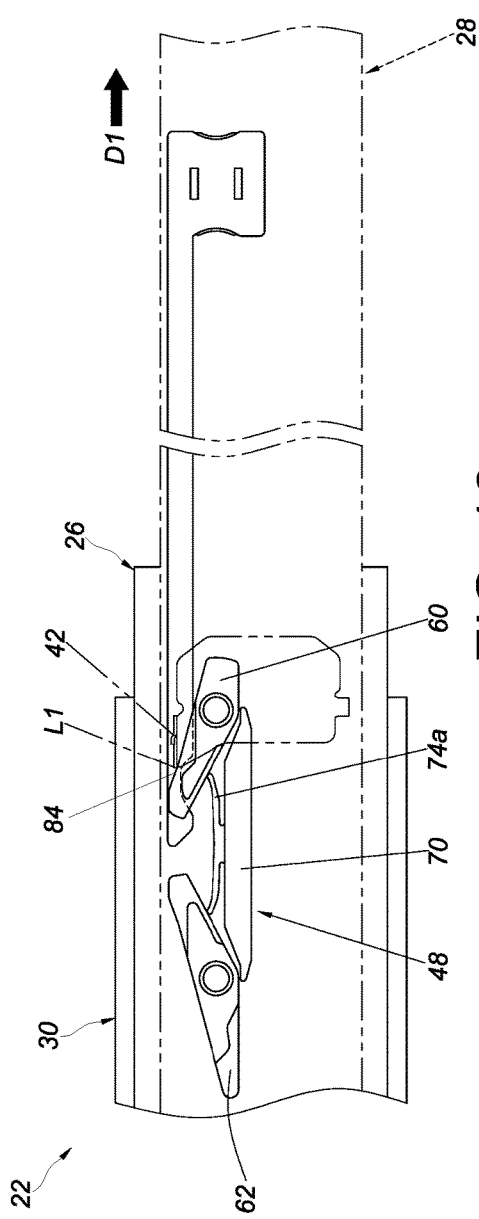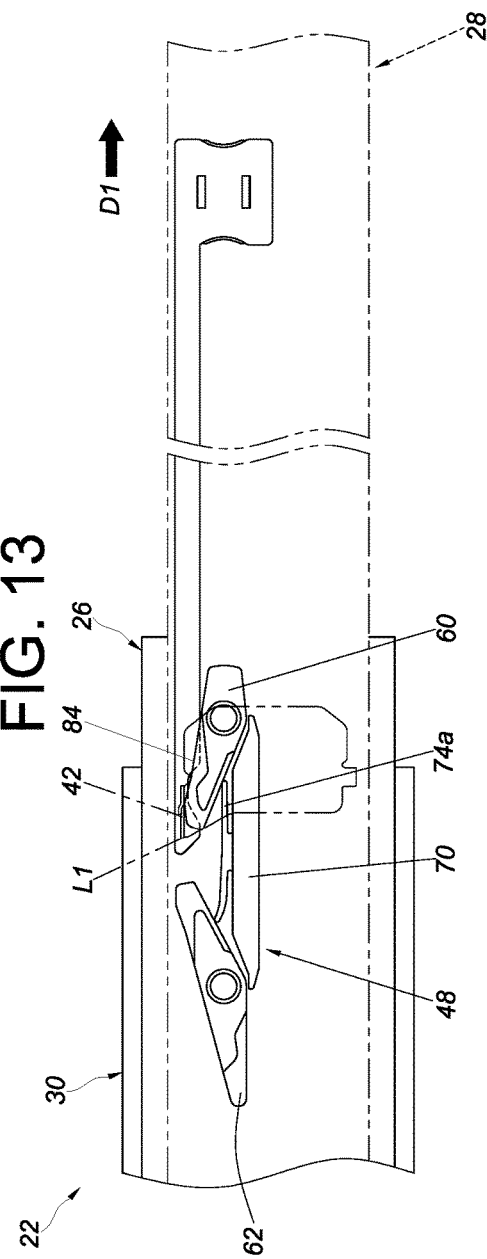

SLIDE RAIL ASSEMBLY AND RAIL KIT THEREOF

FIELD OF THE INVENTION

The present invention relates to a slide rail and more particularly to a slide rail assembly with a two-stage locking function.

BACKGROUND OF THE INVENTION

Generally, a slide rail assembly includes a first rail and a second rail displaceable with respect to the first rail. When the second rail reaches a predetermined position after displacement with respect to the first rail in a particular direction, there is typically a blocking structure between the second rail and the first rail to prevent the second rail from further displacement with respect to the first rail in that particular direction, thereby keeping the second rail at the predetermined position. With the advancement of technology, a similar product has emerged in which not only can a second rail be kept at a predetermined position with respect to a first rail by a blocking mechanism, but also the blocking mechanism can be deactivated by an operating member to allow further displacement of the second rail with respect to the first rail in a certain direction. U.S. Pat. No. 6,412,891 B1, for example, discloses a slide rail assembly that includes an outer member (20), an inner member (30), a stop member (50), and a pivot member (70), wherein the pivot member (70) is pivotally connected to the inner member (30) such that, when the inner member (30) is at a predetermined position with respect to the outer member (20), the stop member (50) blocks the pivot member (70) and thereby prevents the inner member (30) from inadvertent displacement with respect to the outer member (20).

As market demands vary, however, it has been an important issue in the related industries to devise a different slide rail product by furnishing a slide rail assembly with an at least two-stage locking mechanism.

SUMMARY OF THE INVENTION

The present invention provides a slide rail assembly in which a slide rail can be locked in two stages and unlocked in only one step.

According to one aspect of the present invention, a slide rail assembly includes a first rail, a second rail, a first locking mechanism, a second locking mechanism, and an operating member. The first rail has a front end and a blocking portion, wherein the blocking portion has a width. The second rail can be displaced with respect to the first rail and has a first portion and a second portion. The first locking mechanism is arranged on the second rail and includes a first element, a second element, and an elastic element. The second element can be moved to either a first position or a second position with respect to the second rail and can stay at the first position responsive to the elastic force of the elastic element. The first element and the second element define a first space therebetween when the second element is at the first position, wherein the first space is smaller than the width of the blocking portion. The second locking mechanism is arranged on the second rail, too. The operating member is operatively connected to the first locking mechanism and the second locking mechanism. The second element of the first locking mechanism is in contact with the blocking portion of the first rail when the second rail goes through a predetermined section of a process of displacement from a retracted position with respect to the first rail in a first direction. The second element is moved to the second position with respect to the second rail responsive to the second rail being displaced with respect to the first rail in the first direction and reaching a first predetermined position. When the second element is at the second position, the elastic element stores a certain amount of elastic energy due to compression by the second element, and the first space turns into a first locking space; consequently, the blocking portion of the first rail is locked in the first locking space, with the first portion of the second rail extending beyond the front end of the first rail. The first locking mechanism can be unlocked from the blocking portion through operation of the operating member, in order for the elastic element to release the stored elastic energy and thereby bring the second element back to the first position. When the second rail reaches a second predetermined position after displacement with respect to the first rail from the first predetermined position in the first direction, the second locking mechanism is locked to the blocking portion of the first rail, with the second portion of the second rail extending beyond the front end of the first rail. The first locking mechanism and the second locking mechanism can be driven from a locked state into an unlocked state through operation of the operating member, thereby allowing the second rail to be retracted with respect to the first rail in a second direction.

Preferably, the first element is rotatably mounted on the second rail through a first shaft, and the second element is rotatably mounted on the second rail through a second shaft.

Preferably, either the second element or the second rail is provided with a mounting hole, and the second shaft extends through a portion of the mounting hole so that the second element can be displaced with respect to the second shaft.

Preferably, the mounting hole is elliptical.

Preferably, the slide rail assembly further includes a first base. The first base includes a first elastic portion and a second elastic portion for providing an elastic force to the first element and the second element respectively.

Preferably, the first element includes a first guiding feature. The first guiding feature allows the first element to move past a first side of the blocking portion to a second side of the blocking portion in the first direction.

Preferably, the first guiding feature is an inclined or curved surface.

Preferably, the first element and the second element are located at the two sides of the blocking portion respectively and are in the locked state when the second rail is at the first predetermined position.

Preferably, the first element and the second element are configured to enter the unlocked state from the locked state through operation of the operating member, thereby allowing the second rail to be displaced with respect to the first rail from the first predetermined position toward the second predetermined position in the first direction.

Preferably, the second locking mechanism includes a third element pivotally connected to the second rail.

Preferably, the slide rail assembly further includes a second base. The second base includes a third elastic portion for providing an elastic force to the third element.

Preferably, the third element includes a guiding structure. The guiding structure allows the third element to move past the first side of the blocking portion to the second side of the blocking portion in the first direction.

Preferably, the guiding structure is an inclined or curved surface.

Preferably, the third element is located at the second side of the blocking portion and is in the locked state when the second rail is at the second predetermined position.

Preferably, the third element, the second element, and the first element are configured to enter the unlocked state from the locked state through operation of the operating member, thereby allowing the second rail to be retracted with respect to the first rail from the second predetermined position in the second direction.

Preferably, the slide rail assembly further includes a third rail, and the first rail is movably mounted between the third rail and the second rail.

According to another aspect of the present invention, a rail kit includes a slide rail, a first locking mechanism, a second locking mechanism, an elastic element, and an operating member. The first locking mechanism and the second locking mechanism are arranged at two different portions of the slide rail respectively. The first locking mechanism includes a first element and a second element, wherein the second element is rotatably mounted on the slide rail through a shaft. The second locking mechanism includes a third element. Either the second element or the slide rail is provided with a mounting hole. The shaft extends through a portion of the mounting hole so that the second element can be moved to either a first position or a second position. The second element can stay at the first position responsive to the elastic force of the elastic element. The operating member is configured for operating the first locking mechanism and the second locking mechanism and thereby bringing the first locking mechanism and the second locking mechanism from a locked state to an unlocked state. The first element and the second element define a first space therebetween when the second element is at the first position. The first space turns into a first locking space larger than the first space when the second element is at the second position.

Preferably, the first element and the second element of the first locking mechanism are pivotally connected to the slide rail, the rail kit further includes a first base, and the first base includes a first elastic portion and a second elastic portion for providing an elastic force to the first element and the second element respectively. Preferably, the third element of the second locking mechanism is pivotally connected to the slide rail, the rail kit further includes a second base, and the second base includes a third elastic portion for providing an elastic force to the third element.

Preferably, the mounting hole is elliptical.

Preferably, the mounting hole is arranged along the length of the slide rail.

BRIEF DESCRIPTION OF THE DRAWINGS

FIG. 2 is an exploded perspective view of the slide rail assembly according to an embodiment of the present invention;

FIG. 3 is an enlarged view of the circled area A in FIG. 2;

FIG. 4 is an assembled perspective view of the slide rail assembly according to an embodiment of the present invention;

FIG. 5 is an enlarged view of the circled area A in FIG. 4;

FIG. 6 is an assembled view of the second rail and the second element in another embodiment of the invention;

FIG. 8 shows that the second rail of the slide rail assembly according to an embodiment of the present invention is displaced with respect to the first rail in a first direction;

FIG. 9 shows that the second rail of the slide rail assembly according to an embodiment of the present invention is further displaced with respect to the first rail in the first direction;

FIG. 10 shows that the second rail of the slide rail assembly according to an embodiment of the present invention is displaced still further with respect to the first rail in the first direction;

FIG. 11 shows that the second rail of the slide rail assembly according to an embodiment of the present invention reaches a first predetermined position after displacement with respect to the first rail in the first direction, and that the first locking mechanism is locked to the blocking portion of the first rail;

FIG. 13 shows that the second rail of the slide rail assembly according to an embodiment of the present invention is displaced with respect to the first rail in the first direction;

FIG. 14 shows that the second rail of the slide rail assembly according to an embodiment of the present invention is further displaced with respect to the first rail in the first direction;

DETAILED DESCRIPTION OF THE INVENTION

Figure 1:
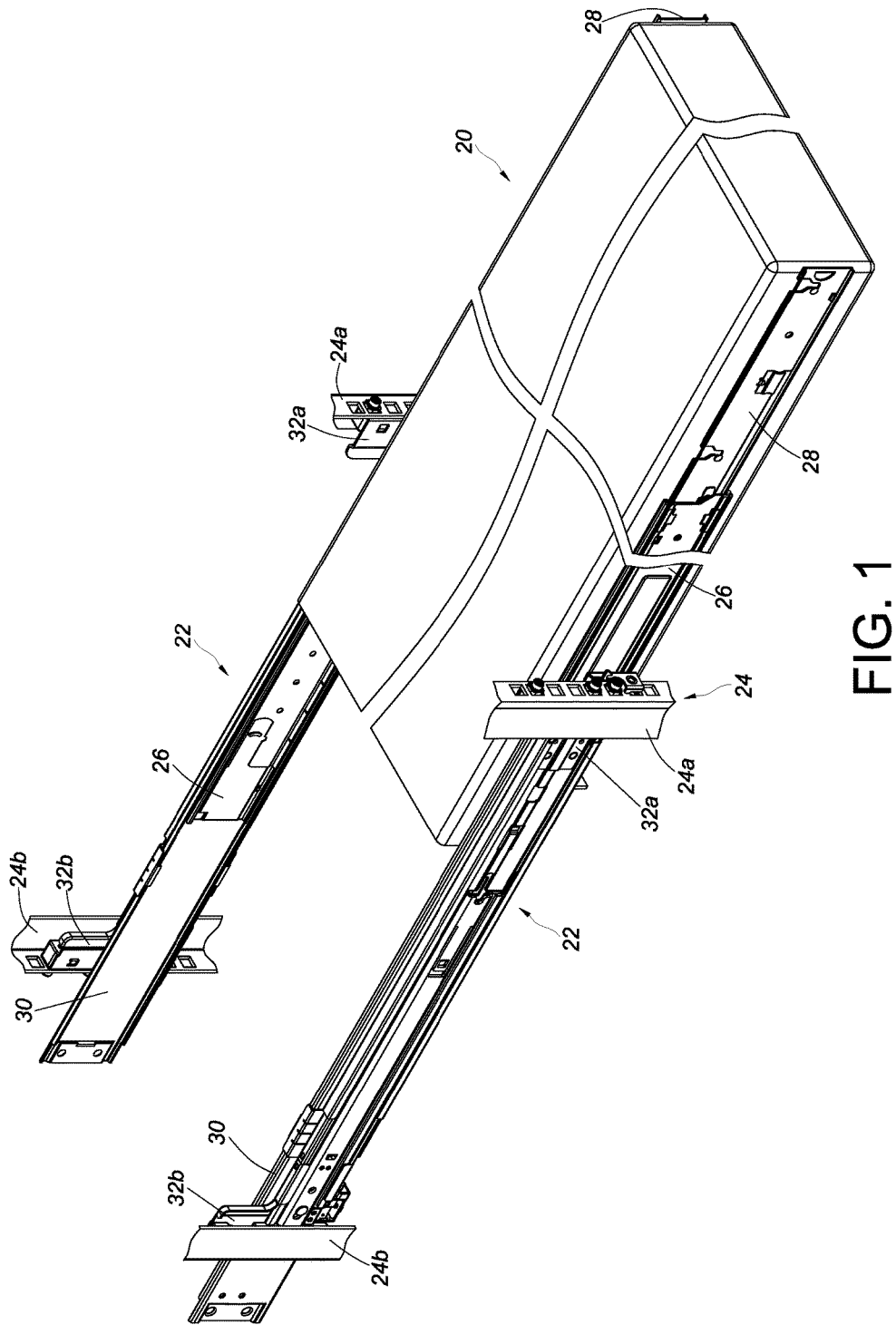
FIG. 1 is a perspective view showing how an object is mounted on a rack through a pair of slide rail assemblies according to an embodiment of the present invention.

Referring to FIG. 1, an object 20 is mounted on the plural posts (e.g., a pair of first posts 24a and a pair of second posts 24b) of a rack 24 via a pair of slide rail assemblies 22 according to an embodiment of the present invention. Each slide rail assembly 22 includes a first rail 26, a second rail 28, and preferably also a third rail 30, wherein the first rail 26 is movably mounted between the third rail 30 and the second rail 28. Each third rail 30 is mounted on the corresponding first post 24a and the corresponding second post 24b through a first bracket 32a and a second bracket 32b respectively. The second rails 28 are used to carry the object 20 so that the object 20 can be pulled out of and then pushed back into the rack 24 by means of the second rails 28.

Referring to FIG. 2 to FIG. 4, the first bracket 32a and the second bracket 32b are respectively arranged at two portions (e.g., a front portion and a rear portion) of the third rail 30 of the slide rail assembly 22, and the third rail 30 defines a first channel 34.

The first rail 26 is movably mounted in the first channel 34 of the third rail 30. The first rail 26 includes a first wall 26a, a second wall 26b, and a sidewall 26c connected between the first wall 26a and the second wall 26b. The first wall 26a, the second wall 26b, and the sidewall 26c jointly define a second channel 36. More specifically, the first rail 26 has a front end 38, a rear end 40, and a blocking portion 42 (see FIG. 2). The blocking portion 42 lies between the front end 38 and the rear end 40 and is in the second channel 36, preferably adjacent to the front end 38 of the first rail 26. The blocking portion 42 may be a protruding element integrated with the sidewall 26c of the first rail 26, or a fitting 44 including the blocking portion 42 may be connected to the first rail 26 by riveting, soldering, or threaded connection such that the blocking portion 42 protrudes from the sidewall 26c of the first rail 26; the present invention has no limitation in this regard. The second rail 28 is movably mounted in the second channel 36 of the first rail 26.

The second rail 28 includes a first wall 28a, a second wall 28b, and a sidewall 28c connected between the first wall 28a and the second wall 28b. The slide rail assembly 22 further includes a first locking mechanism 46, a second locking mechanism 48, and an operating member 50. The first locking mechanism 46 and the second locking mechanism 48 are arranged at two different portions of the second rail 28 respectively. For example, the first locking mechanism 46 is closer to the front end of the second rail 28 than the second locking mechanism 48, and the second locking mechanism 48 is closer to the rear end of the second rail 28 than the first locking mechanism 46. In practice, however, the two locking mechanisms are not necessarily so arranged. More specifically, the first locking mechanism 46 and the second locking mechanism 48 are located on the sidewall 28c of the second rail 28 and are spaced apart from each other. The second rail 28 (also referred to herein as the slide rail), the first locking mechanism 46, the second locking mechanism 48, and the operating member 50 constitute a rail kit.

The first locking mechanism 46 includes a first element 52 and a second element 54. The first element 52 and the second element 54 are separately and rotatably mounted on the second rail 28. More specifically, the first element 52 and the second element 54 are pivotally connected to the sidewall 28c of the second rail 28 by a first shaft 56 and a second shaft 58 (the latter also referred to herein as the shaft) respectively. In a preferred embodiment, the second element 54 can be longitudinally displaced with respect to the first element 52 within a bordered area. For example, the longitudinal displacement is made possible by providing either the second element 54 or the second rail 28 with a mounting hole 55. The mounting hole 55 is shown in FIG. 3 as provided in the second element 54.

More specifically, the mounting hole 55 is an elliptical hole configured to be penetrated by the second shaft 58. Preferably, the mounting hole 55 is arranged in a longitudinal direction, i.e., along the length (or longitudinal direction) of the second rail 28. Referring to FIG. 5, the body of the second shaft 58 extends through a portion of the mounting hole 55 and is connected to the sidewall 28c of the second rail 28 so that the second element 54 can be longitudinally displaced with respect to the second shaft 58. For example, the mounting hole 55 has a hole diameter W1 greater than the shaft diameter W2 of the second shaft 58, and the second element 54 is displaceable with respect to the second shaft 58 within an area defined by the difference between the hole diameter W1 and the shaft diameter W2. In addition, an elastic element 57 is arranged between the second rail 28 and the second element 54 in order for the second element 54 to stay at a first position M1 with respect to the second shaft 58 or the second rail 28 responsive to the elastic force of the elastic element 57. In another embodiment as shown in FIG. 6, the mounting hole 55 is provided in the second rail 28 instead, and the second element 54 extends through a portion of the mounting hole 55 via the second shaft 58 and is therefore equally capable of longitudinal displacement within a bordered area. That is to say, the configurations of the mounting hole 55, of the second element 54, and of the second shaft 58 are not limited to those shown in FIG. 5.

Referring to FIG. 2 and FIG. 4, the second locking mechanism 48 includes a third element 60 and preferably also a fourth element 62. The third element 60 and the fourth element 62 are separately and rotatably mounted on the second rail 28. More specifically, the third element 60 and the fourth element 62 are pivotally connected to the sidewall 28c of the second rail 28 by a third shaft 64 and a fourth shaft 66 respectively.

Preferably, the slide rail assembly 22 or the rail kit further includes a first base 68 and a second base 70, both fixedly connected to the sidewall 28c of the second rail 28. The first base 68 includes a first elastic portion 72a and a second elastic portion 72b for providing an elastic force to the first element 52 and the second element 54 respectively. The second base 70 includes a third elastic portion 74a and a fourth elastic portion 74b for providing an elastic force to the third element 60 and the fourth element 62 respectively.

The operating member 50 is configured to operate the first locking mechanism 46 and the second locking mechanism 48. For example, the operating member 50 can be used to operate the first element 52 and the second element 54 of the first locking mechanism 46 and the third element 60 of the second locking mechanism 48. Here, by way of example, the operating member 50 is arranged at the second rail 28 and is operatively connected to the first element 52 and the second element 54 of the first locking mechanism 46 and the third element 60 of the second locking mechanism 48.

More specifically, the operating member 50 includes an extension portion 50a, and the extension portion 50a has a predetermined length extending in the same direction as the length of the second rail 28. Preferably, the operating member 50 further includes an operating portion 50b connected to the extension portion 50a. The extension portion 50a includes a plurality of driving structures such as a first driving structure 76a, a second driving structure 76b, and a third driving structure 76c arranged sequentially along the length of the extension portion 50a. The operating member 50 operates the first element 52, the second element 54, and the third element 60 through the driving structures 76a, 76b, and 76c respectively.

Preferably, the first element 52 includes a first guiding feature 78, and the first guiding feature 78 is an inclined surface or a curved surface. Preferably, the third element 60 includes a guiding structure 84, and the guiding structure 84 is an inclined surface or a curved surface.

Figure 7:
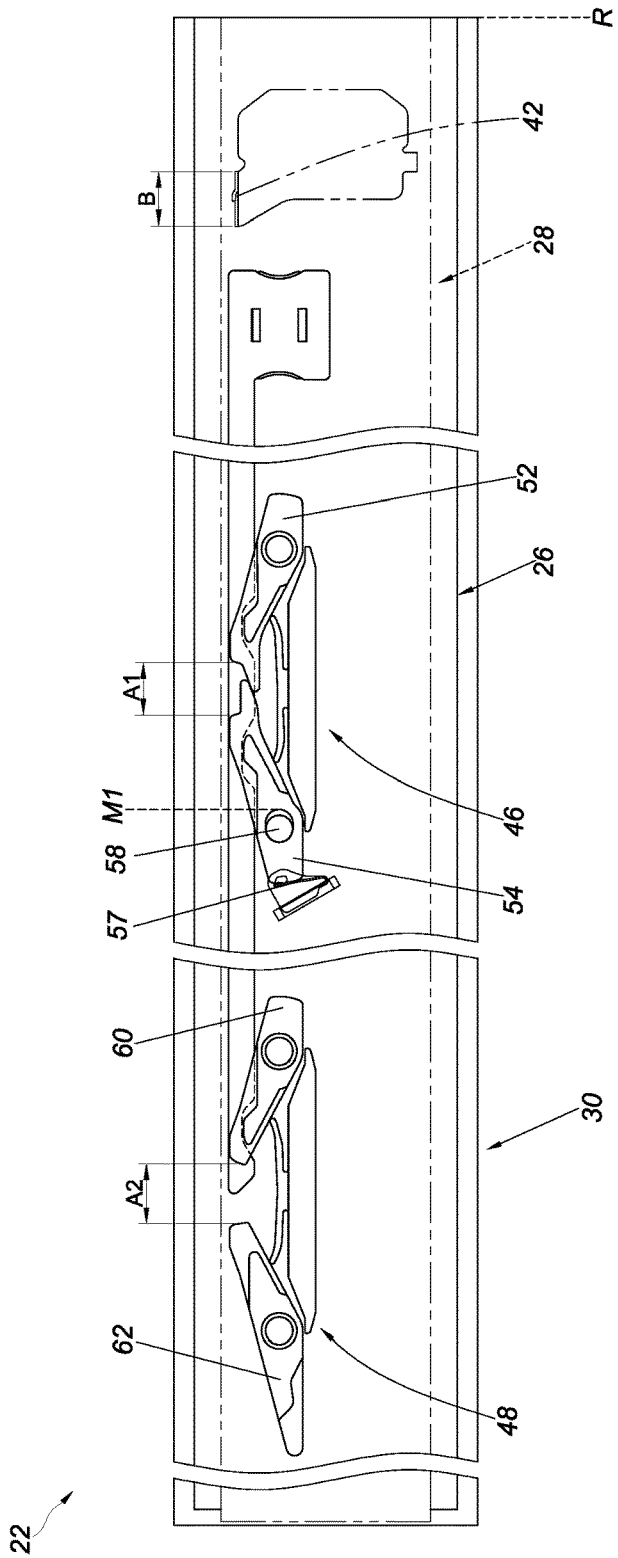
FIG. 7 shows the slide rail assembly in a retracted state according to an embodiment of the present invention.

Referring to FIG. 7, in which the slide rail assembly 22 is shown in a retracted state, the first rail 26 is retracted with respect to the third rail 30, and the second rail 28 is at a retracted position R with respect to the first rail 26. It is worth mentioning that the second element 54 of the first locking mechanism 46 stays at the first position M1 with respect to the second rail 28 responsive to the elastic force of the elastic element 57. While the second element 54 is at the first position M1, the first element 52 and the second element 54 define a first space A1 therebetween, wherein the first space A1 is smaller than the width B of the blocking portion 42 of the first rail 26. Furthermore, the third element 60 and the fourth element 62 of the second locking mechanism 48 define a second space A2 therebetween, and the width B of the blocking portion 42 of the first rail 26 is smaller than the second space A2. The relationship between A1, A2, and B can be expressed mathematically as A1<B<A2.

Referring to FIG. 8, the second rail 28 is displaced a certain distance from the retracted position R with respect to the first rail 26 in a first direction D1 (e.g., an opening direction), bringing the first guiding feature 78 of the first element 52 into contact with a first side L1 of the blocking portion 42 of the first rail 26.

When the second rail 28 is further displaced in the first direction D1, as shown in FIG. 9, the first element 52 is tilted by an angle due to the contact between the first guiding feature 78 and the first side L1 of the blocking portion 42. The tilt allows the first element 52 to move past the first side L1 of the blocking portion 42 of the first rail 26 in the first direction D1 such that the first elastic portion 72a of the first base 68 stores a certain amount of elastic energy.

When the second rail 28 is further displaced with respect to the first rail 26 in the first direction D1 and goes through a predetermined section of the displacement process, as shown in FIG. 10 and FIG. 11, the second element 54 of the first locking mechanism 46 is in contact with, or more particularly pressed against, the first side L1 of the blocking portion 42 of the first rail 26 (see FIG. 10). Once the second rail 28 reaches a first predetermined position P1 after further displacement with respect to the first rail 26 in the first direction D1, as shown in FIG. 11, the second element 54 is at a second position M2 with respect to the second rail 28, causing compression of the elastic element 57. As a result, the elastic element 57 stores a certain amount of elastic energy, and the first space A1 is expanded into a first locking space A11 in which the blocking portion 42 of the first rail 26 can be, and is subsequently, locked, with a first portion X1 of the second rail 28 extending beyond the front end 38 of the first rail 26. When the second rail 28 reaches the first predetermined position P1, the first element 52 arrives at a second side L2 of the blocking portion 42 responsive to the elastic energy released by the first elastic portion 72a of the first base 68. Furthermore, the second element 54 is located at the first side L1 of the blocking portion 42. Thus, the first element 52 and the second element 54 are located at the two sides of the blocking portion 42 respectively and are in a locked state S1 to prevent the second rail 28 from inadvertent displacement with respect to the first rail 26.

Figure 12:
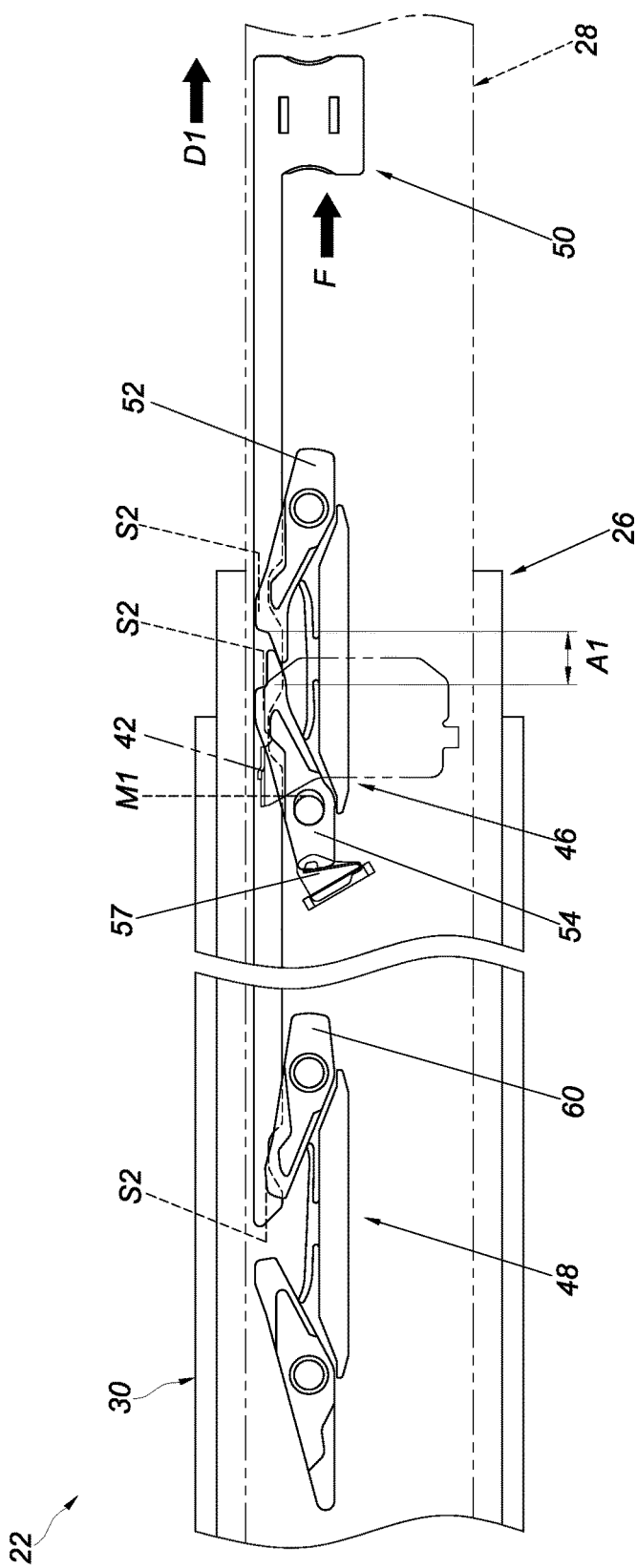
FIG. 12 shows that the first locking mechanism of the slide rail assembly according to an embodiment of the present invention is unlocked from the blocking portion of the first rail by the operating member, allowing the second rail to be displaced in the first direction.

Referring to FIG. 12, the operating member 50 can then be operated to unlock the first locking mechanism 46 from the blocking portion 42. For example, a user can apply a force F to and thereby operate the operating member 50 in order for the operating member 50 to tilt each of the first element 52 and the second element 54 by an angle, thus bringing the first element 52 and the second element 54 from the locked state S1 into an unlocked state S2, in which the second rail 28 can be displaced further in the first direction D1 with respect to the first rail 26 now that the first locking mechanism 46 is no longer locked to the blocking portion 42. Once the first locking mechanism 46 is unlocked from the blocking portion 42, the second element 54 is moved away from the first side L1 of the blocking portion 42 of the first rail 26, and because of that, the elastic element 57 releases the elastic energy stored therein and applies an elastic force to the second element 54, moving the second element 54 back to the first position M1. The first locking space A11, therefore, shrinks back to the first space A1.

As soon as the first locking mechanism 46 is unlocked from the blocking portion 42, the second rail 28 can be displaced from the first predetermined position P1 with respect to the first rail 26 in the first direction D1, as shown in FIG. 13, and while the second rail 28 goes through a predetermined section of the displacement process, the guiding structure 84 of the third element 60 of the second locking mechanism 48 is in contact with the first side L1 of the blocking portion 42 of the first rail 26.

When the second rail 28 is further displaced in the first direction D1, as shown in FIG. 14, the third element 60 is tilted by an angle due to the contact between the guiding structure 84 and the first side L1 of the blocking portion 42. The tilt allows the third element 60 to move past the first side L1 of the blocking portion 42 of the first rail 26 in the first direction D1 such that the third elastic portion 74a of the second base 70 stores a certain amount of elastic energy.

Figure 15:
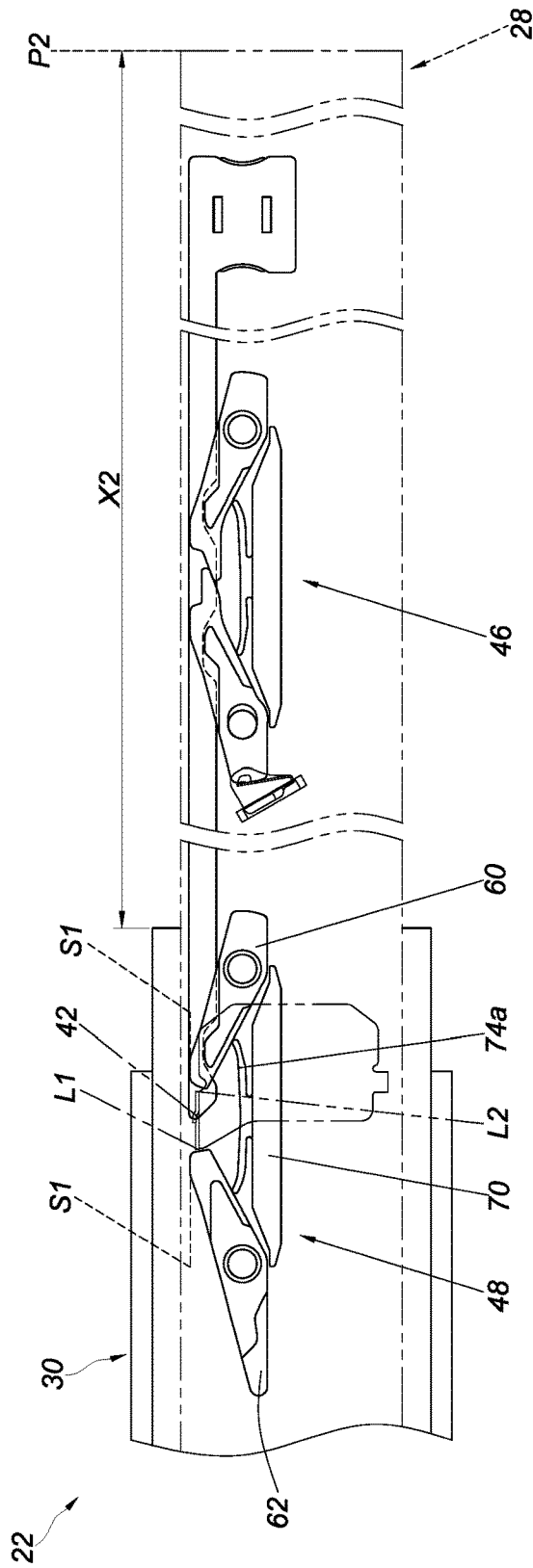
FIG. 15 shows that the second rail of the slide rail assembly according to an embodiment of the present invention reaches a second predetermined position after displacement with respect to the first rail in the first direction, and that the second locking mechanism is locked to the blocking portion of the first rail.

When the second rail 28 reaches a second predetermined position P2 after further displacement in the first direction D1 with respect to the first rail 26, as shown in FIG. 15, the slide rail assembly 22 enters a second extended state, in which the second locking mechanism 48 is locked to the blocking portion 42 of the first rail 26, with a second portion X2 of the second rail 28 extending beyond the front end 38 of the first rail 26. For example, when the second rail 28 reaches the second predetermined position P2 after displacement with respect to the first rail 26 in the first direction D1, the third element 60 arrives at the second side L2 of the blocking portion 42 responsive to the elastic energy released by the third elastic portion 74a of the second base 70. Furthermore, the fourth element 62 is located at the first side L1 of the blocking portion 42. Thus, the third element 60 and the fourth element 62 are located at the two sides of the blocking portion 42 respectively and are in a locked state S1 to prevent the second rail 28 from inadvertent displacement with respect to the first rail 26.

Figure 16:
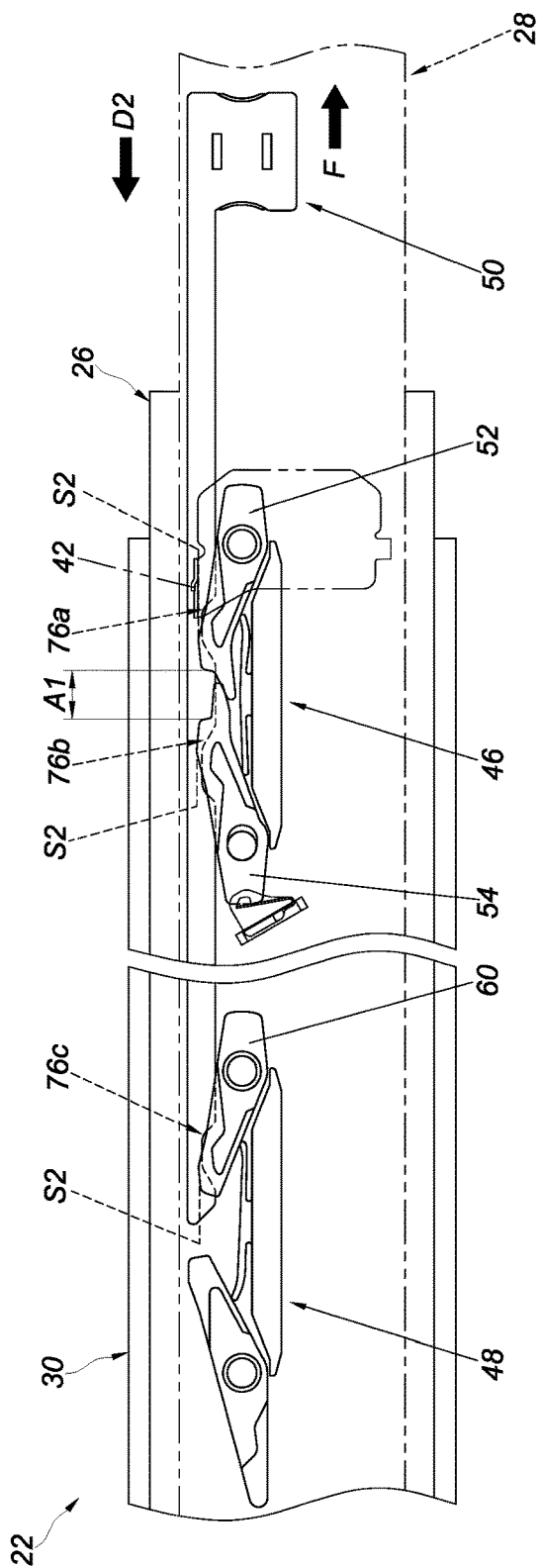
FIG. 16 shows that the operating member of the slide rail assembly according to an embodiment of the present invention is operated to bring the related elements of the second locking mechanism and of the first locking mechanism from the locked state to the unlocked state, and that that the second rail of the slide rail assembly is subsequently retracted with respect to the first rail in a second direction.

Referring to FIG. 16, the operating member 50 can then be used to operate the third element 60, the second element 54, and the first element 52 through the third driving structure 76c, the second driving structure 76b, and the first driving structure 76a respectively. For example, a user can apply a force F to the operating member 50 and thereby drive the third element 60 of the second locking mechanism 48 and the second element 54 and the first element 52 of the first locking mechanism 46 from the locked state S1 into the unlocked state S2, in which the second locking mechanism 48 is no longer locked to the blocking portion 42 (and neither will the first locking mechanism 46), and in which the blocking portion 42 of the first rail 26 will not be locked in the first space A1 of the first locking mechanism 46, either (because the first space A1 is smaller than the width B of the blocking portion 42 of the first rail 26). Thus, the second rail 28 can be retracted with respect to the first rail 26 directly from the second predetermined position P2 in a second direction D2. That is to say, while the slide rail assembly 22 provides a lock that can be activated in two stages, the two-stage lock can be completely deactivated in only one step.

According to the above, the embodiments disclosed herein are characterized by the two-stage locking mechanism of the slide rail assembly 22. When the second rail 28 is at the second predetermined position P2 with respect to the first rail 26, a user can retract the second rail 28 directly from the second predetermined position P2 to the position shown in FIG. 7 in the second direction D2 with respect to the first rail 26 simply by operating the operating member 50 because the operating member 50 will drive the first locking mechanism 46 and the second locking mechanism 48 simultaneously from the locked state into the unlocked state.

While the present invention has been disclosed through the foregoing preferred embodiments, it should be understood that the embodiments are not intended to be restrictive of the scope of the invention. The scope of patent protection sought by the applicant is defined by the appended claims.

What is claimed is:

1. A slide rail assembly, comprising:
a first rail having a front end and a blocking portion, wherein the blocking portion has a width;
a second rail displaceable with respect to the first rail, wherein the second rail has a first portion and a second portion;
a first locking mechanism arranged on the second rail, wherein the first locking mechanism includes a first element, a second element, and an elastic element; the second element is movable to either one of a first position and a second position with respect to the second rail; the second element remains at the first position responsive to an elastic force of the elastic element; the first element and the second element define a first space therebetween when the second element is at the first position; and the first space is smaller than the width of the blocking portion;
a second locking mechanism arranged on the second rail; and
an operating member operatively connected to the first locking mechanism and the second locking mechanism;
wherein the second element of the first locking mechanism is in contact with the blocking portion of the first rail when the second rail goes through a predetermined displacement from a retracted position with respect to the first rail in a first direction; the second element is moved to the second position with respect to the second rail responsive to the second rail being displaced with respect to the first rail in the first direction and reaching a first predetermined position; and when the second element is at the second position, the elastic element stores elastic energy due to compression by the second element, the first space turns into a first locking space, and the blocking portion of the first rail is locked in the first locking space, with the first portion of the second rail extending beyond the front end of the first rail;
wherein the first locking mechanism is unlockable from the blocking portion through operation of the operating member, in order for the elastic element to release the stored elastic energy and thereby bring the second element back to the first position; and when the second rail reaches a second predetermined position after displacement with respect to the first rail from the first predetermined position in the first direction, the second locking mechanism is locked to the blocking portion of the first rail, with the second portion of the second rail extending beyond the front end of the first rail; and
wherein the first locking mechanism and the second locking mechanism are configured to be driven from a locked state into an unlocked state through operation of the operating member, thereby allowing the second rail to be retracted with respect to the first rail in a second direction.

2. The slide rail assembly of claim 1, wherein the first element is rotatably mounted on the second rail through a first shaft, and the second element is rotatably mounted on the second rail through a second shaft.

3. The slide rail assembly of claim 2, wherein one of the second element and the second rail is provided with a mounting hole, and the second shaft extends through a portion of the mounting hole.

4. The slide rail assembly of claim 3, wherein the mounting hole is elliptical.

5. The slide rail assembly of claim 4, further comprising a first base, wherein the first base includes a first elastic portion and a second elastic portion for providing an elastic force to the first element and the second element respectively.

6. The slide rail assembly of claim 5, wherein the first element includes a first guiding feature, and the first guiding feature allows the first element to move past a first side of the blocking portion to a second side of the blocking portion in the first direction.

7. The slide rail assembly of claim 6, wherein the first guiding feature is one of an inclined surface and a curved surface.

8. The slide rail assembly of claim 6, wherein when the second rail is at the first predetermined position, the first element and the second element are located at the two sides of the blocking portion respectively and are in the locked state.

9. The slide rail assembly of claim 8, wherein the first element and the second element are configured to enter the unlocked state from the locked state through operation of the operating member, thereby the second rail being displaceable with respect to the first rail from the first predetermined position toward the second predetermined position in the first direction.

10. The slide rail assembly of claim 9, wherein the second locking mechanism includes a third element, and the third element is pivotally connected to the second rail.

11. The slide rail assembly of claim 10, further comprising a second base, wherein the second base includes a third elastic portion for providing an elastic force to the third element.

12. The slide rail assembly of claim 11, wherein the third element includes a guiding structure, and the guiding structure allows the third element to move past the first side of the blocking portion to the second side of the blocking portion in the first direction.

13. The slide rail assembly of claim 12, wherein the guiding structure is one of an inclined surface and a curved surface.

14. The slide rail assembly of claim 12, wherein when the second rail is at the second predetermined position, the third element is located at the second side of the blocking portion and is in the locked state.

15. The slide rail assembly of claim 14, wherein the third element, the second element, and the first element are configured to enter the unlocked state from the locked state through operation of the operating member, thereby the second rail being retractable with respect to the first rail from the second predetermined position in the second direction.

16. The slide rail assembly of claim 1, further comprising a third rail, wherein the first rail is movably mounted between the third rail and the second rail.

17. A rail kit, comprising:
a slide rail;
a first locking mechanism and a second locking mechanism respectively arranged at two different portions of the slide rail, wherein the first locking mechanism includes a first element and a second element, the second element is rotatably mounted on the slide rail through a shaft, and the second locking mechanism includes a third element;

a mounting hole provided in one of the second element and the slide rail, the shaft extending through a portion of the mounting hole and the second element is thereby movable to either one of a first position and a second position;

an elastic element, wherein the second element remains at the first position responsive to an elastic force of the elastic element; and an operating member for operating the first locking mechanism and the second locking mechanism and thereby bringing the first locking mechanism and the second locking mechanism from a locked state to an unlocked state;

wherein the first element and the second element define a first space therebetween when the second element is at the first position;

wherein the first space turns into a first locking space larger than the first space when the second element is at the second position; and wherein the first element and the second element of the first locking mechanism are pivotally connected to the slide rail, the rail kit further comprising a first base, and the first base includes a first elastic portion and a second elastic portion for providing an elastic force to the first element and the second element respectively; and wherein the third element of the second locking mechanism is pivotally connected to the slide rail, the rail kit further comprising a second base, and the second base includes a third elastic portion for providing an elastic force to the third element.

18. The rail kit of claim 17, wherein the mounting hole is elliptical.

19. The rail kit of claim 18, wherein the mounting hole is arranged along a length of the slide rail.

* * * * *